United States Patent [19]

Chiba

[11] Patent Number: 5,150,734

[45] Date of Patent: Sep. 29, 1992

[54] PROCESSING APPARATUS AT REDUCED PRESSURE AND VALVE USED THEREFOR

[75] Inventor: Takahiro Chiba, Iwate, Japan

[73] Assignee: Fujitsu Limited, Kawasaki, Japan

[21] Appl. No.: 508,556

[22] Filed: Apr. 13, 1990

[30] Foreign Application Priority Data

Apr. 13, 1989 [JP] Japan .................................. 1-93573

[51] Int. Cl.⁵ ........................ F16K 3/32; F16K 31/122
[52] U.S. Cl. ..................................... 137/567; 251/62; 251/205; 251/326; 137/565
[58] Field of Search .................. 251/205, 326, 324, 62; 137/567, 565

[56] References Cited

U.S. PATENT DOCUMENTS

| | | | |
|---|---|---|---|
| 4,212,317 | 7/1980 | Patrick et al. | 137/565 |
| 4,214,730 | 7/1980 | Baumann | 251/205 X |
| 4,776,564 | 10/1988 | Westenberg | 251/328 X |
| 4,798,227 | 1/1989 | Goodwin | 251/205 X |

Primary Examiner—Arnold Rosenthal

Attorney, Agent, or Firm—Staas & Halsey

[57] ABSTRACT

An apparatus for processing semiconductor wafers at reduced pressure comprising a vacuum chamber and a pumping system connected with the chamber. The pumping system includes at least a roughing pump, an exhaust pipe connecting the chamber with the roughing pump and a valve inserted in the exhaust pipe for opening and closing gas flow therethrough. The valve comprises: a valve casing having valve inlet and outlet openings connected with the exhaust pipe; a valve seat comprising a gasket surrounding at least one of the openings and having a first surface; and a valve plug having a second surface, the second surface being parallel with the first surface and contacting airtightly with the gasket at a valve closed position, the valve plug being movable substantially in the direction of the first surface for closing and opening the valve, thereby causing the opening for gas flow to be opened or closed gradually by the movement of the second surface of the valve plug. The valve functions to gradually change its conductance during opening and closing operations.

23 Claims, 6 Drawing Sheets

PROCESSING APPARATUS AT REDUCED PRESSURE AND VALVE USED THEREFOR

BACKGROUND OF THE INVENTION

1. Field of the Invention

The present invention relates to an apparatus for processing semiconductor wafers at reduced pressure in a chamber, and a valve used therefor. In processes of manufacturing semiconductor integrated circuits, apparatuses which perform processing of semiconductor wafers placed in a vacuum chamber are widely used. A vacuum chamber used with such an apparatus is connected to an external exhaust system and has the function of maintaining a high degree of vacuum. Also, the vacuum chamber allows the introduction of the necessary source gases. Valves are used in the processing apparatus to control the pressure within the chamber and the introduction of gases. The present invention particularly relates to a processing apparatus having a valve inserted between the vacuum chamber and the exhaust system that is capable of accurately controlling the flow of gas at the start of a processing operation.

2. Description of the Related Art

In general, in a processing apparatus at reduced pressure, in addition to the so-called leak valve for keeping the interior of the chamber airtight against the directly contacting atmosphere, various valves are used between the chamber and an exhaust system for a low degree of vacuum, and between exhaust systems for low and high degrees of vacuum.

In general, the chamber, the interior of which is at atmospheric pressure, is exhausted in the following manner. First, the interior of the chamber is connected to a low-vacuum exhaust system, such as an oil-sealed rotary vacuum pump, so as to be evacuated to a degree of vacuum of the order of, e.g., $10^{-2}$ to $10^{-3}$ Pa. Subsequently, the connection of the chamber is switched by valves to a high-vacuum exhaust system, such as an oil or mercury diffusion pump or an ion pump of varying type, so as to achieve a high degree of vacuum of, e.g., $10^{-8}$ to $10^{-9}$ Pa, or sometimes, a very high degree of vacuum of, e.g., $10^{-10}$ Pa.

Between the chamber and the vacuum exhaust system connected therewith, a valve of varying type, such as a gate valve or lift valve, is used in accordance with the configuration of the associated pipes or the purpose of use. Among usable valves, a lift valve is particularly suitable for use in the main exhaust passage because it is possible to achieve a relatively large opening area and, hence, to effect efficient exhaust even when the degree of vacuum within the chamber has already risen and a low pressure prevails therein.

However, the action of opening or closing a lift valve is such that it either completely opens or completely closes. With this action, therefore, it is impossible to vary the sectional area of the valve opening and control the amount of exhaust accordingly.

If such a lift valve is disposed between the chamber of a processing apparatus and the vacuum exhaust system, this leads to the following problem. At the start of exhausting the interior of the chamber which is at atmospheric pressure, during the so-called rough pumping, upon the opening of the lift valve, a great difference in pressure occurs, whereby air within the chamber is rapidly discharged in such a manner that the air within the chamber is temporarily made turbulent.

Within a chamber of a processing apparatus, a lot of particles are generated by processing. In addition, complicated jigs, etc. are generally installed. Therefore, the interior of the chamber tends to be difficult to keep clean.

Although the particles may vary in accordance with the processing performed by the apparatus and the subject of the processing, the particles are usually small light particles such as fine pieces, fine powdery particles or scales from thin films which are made of various materials such as metals or dielectric materials.

As a result, in the chamber of a processing apparatus in which a conventional valve is used, particles, such as those described above, are stirred up when air is made turbulent during rough pumping.

The thus stirred-up particles may adhere to the surface of a substrate which is disposed within the apparatus and is to be processed. If the apparatus is a deposition or sputtering apparatus, particles may adhere to the evaporation source or target. These problems are serious because they can lower the yield of the process.

SUMMARY OF THE INVENTION

An object of the present invention is to provide an apparatus for processing semiconductor wafers at reduced pressure, more specifically, such a processing apparatus in which rapidly occurring difference in pressure during rough pumping is mitigated.

Another object of the present invention is to achieve the mitigation of the rapid difference in pressure without adding any special mechanism but by merely improving a single valve mechanism included in the exhaust system connected with the chamber where processing at reduced pressure proceeds.

A further object of the present invention is to provide a valve for opening and closing the flow of gas, the resistance (or conductance) of which can be finely controlled, and the resistance of which at a valve open position is small (i.e., the conductance is great at this position).

The above-stated objects are achieved by inserting a valve according to the present invention in a pipe connecting the vacuum chamber with a roughing pump.

The valve structure according to the present invention includes a valve plug which is, at a valve closed position, in airtight contact with a ring-shaped valve seat, and which is, at a valve open position, slidable in a lateral direction parallel to a surface of the valve seat, the sliding movement gradually increasing the area of opening.

The valve structure according to the present invention further includes a cut portion formed on a surface of the valve plug which faces the valve seat, in order to make the increase in area of the opening more gradual.

BRIEF DESCRIPTION OF THE DRAWINGS

Throughout the above-mentioned drawings, identical reference numerals are used to designate the same or similar component parts.

DESCRIPTION OF THE PREFERRED EMBODIMENTS

Figure 1:
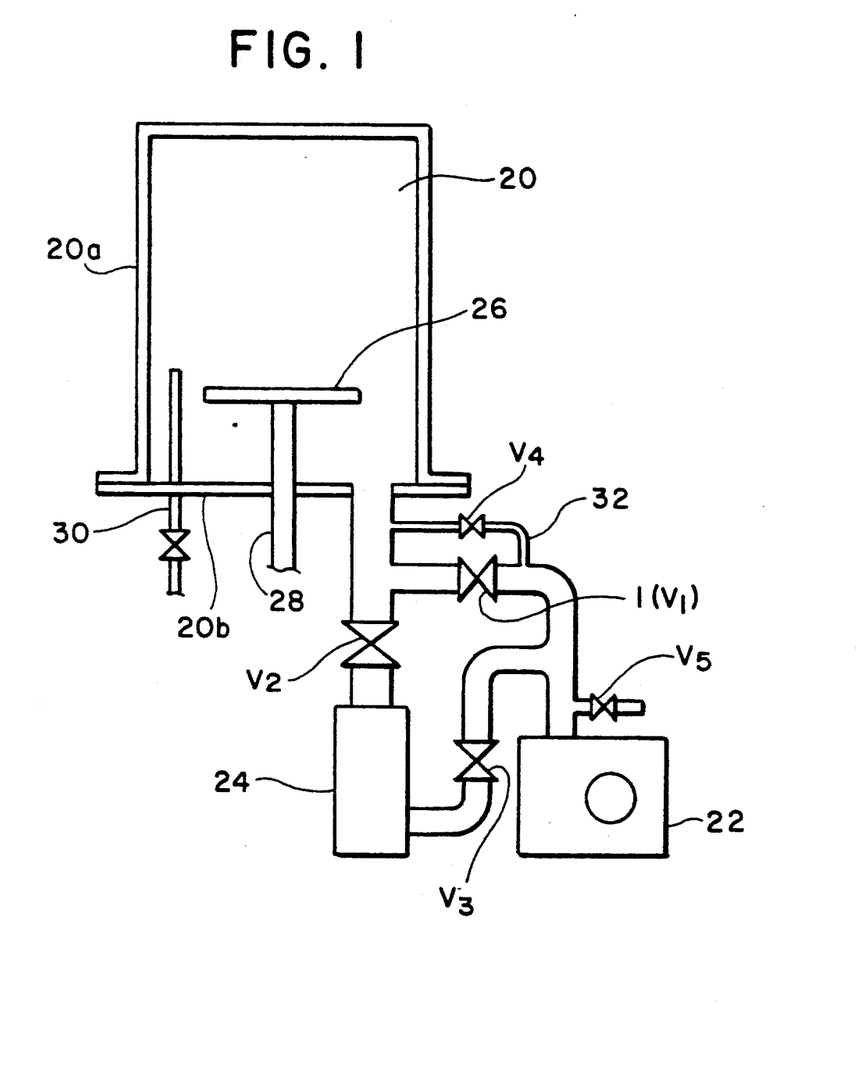
FIG. 1 is a block diagram of a processing apparatus at reduced pressure to which the present invention may be applied.

FIG. 1 is a block diagram showing a processing apparatus at reduced pressure which the present invention is concerned with. A vacuum chamber is employed in lot of processes among various semiconductor wafer processes. For example, a vacuum chamber employed in such processes as vacuum evaporation, chemical vapor deposition, dry etching and ion implantation. In accordance with the process to be performed, the necessary mechanism is added. FIG. 1 mainly shows a vacuum chamber and an exhaust mechanism, which are commonly necessary to the above-mentioned processes.

A vacuum chamber 20 is an enclosure means comprising an upper member 20(a) and a base member 20(b). A semiconductor wafer (not shown) is mounted on a stage 26 and is thus disposed within the vacuum chamber 20. The stage 26 is, when required, rotated about a support 28, and a mechanism (not shown) for this purpose is additionally provided on the outside of the vacuum chamber 20. When, as in the case of a chemical vapor deposition or dry etching process, source gas or inert gas is to be introduced into the vacuum chamber 20 from the outside, a gas introduction pipe 30 is provided. However, detailed description of this pipe will be omitted. Also, the description and illustration of equipment such as a heater for heating wafer that is provided in the vacuum chamber, and electrodes which are necessary to processing will be omitted.

FIG. 1 illustrates an example in which an oil-sealed rotary pump 22 is used in a low-vacuum exhaust system whereas an oil diffusion pump 24 is used in a high-vacuum exhaust system. These pumps 22 and 24 and the vacuum chamber 20 are connected with each other by pipes, and a plurality of valves $V_1$, $V_2$, $V_3$, $V_4$, $V_5$, etc. are provided to open and close various passages within the pipes.

Prior to exhaust, the wafer to be processed is placed within the vacuum chamber 20, the interior of which is at atmospheric pressure. The interior of the chamber is first evacuated from atmospheric pressure to a low degree of vacuum by the oil-sealed rotary pump 22. During this operation, the valves $V_1$ and $V_3$ are kept open while the other valves are closed. When the vacuum within the vacuum chamber reaches a degree of about $10^{-2}$ Pa, the valve $V_2$ disposed in the circuit connected to the oil diffusion pump 24 is opened while the valve $V_1$ is closed, so as to evacuate the vacuum chamber to a high degree of vacuum.

In order to make the flow of gas through the valve $V_1$ as good as possible, the valve $V_1$ usually comprises a lift valve which is capable of achieving a relatively large opening area. Therefore, upon the opening of the valve $V_1$, the interior Of the vacuum chamber, which is at atmospheric pressure, becomes directly connected to a low degree of vacuum generated by the oil-sealed rotary pump 22. As a result, rapid difference in pressure occurs to temporarily make the air within the vacuum chamber 20 turbulent. This leads to the problem of contaminating the semiconductor wafer to be processed.

In order to overcome the problem, the conventional practice is to adopt a bypass system. As shown in FIG. 1, a bypass 32 having a small exhaust conductance (i.e., a great exhaust resistance) is provided. During an early stage of an exhausting operation, while the valve $V_1$ is kept closed, the valve $V_4$ provided in the bypass is kept open. Since the bypass 32 has a small conductance, it does not cause much turbulence in the flow of air within the vacuum chamber 20. If the valve $V_1$ is opened after the pressure within the vacuum chamber has dropped to a certain degree, this makes it possible to avoid the above-mentioned problem.

In order to make such a bypass circuit unnecessary, the present invention features a conductance varying mechanism in the valve $V_1$. Before proceeding to the description of a valve according to the present invention, the structure of a conventional lift valve will be described.

Figure 2A:
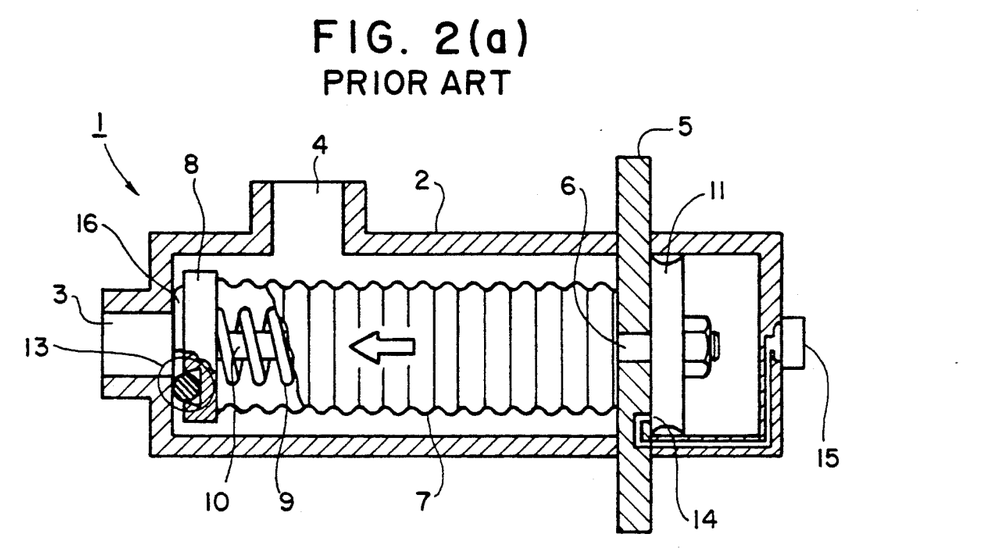
FIGS. 2(a) and 2(b) are partially cut-away sectional views of the structure of a conventional lift valve, FIG. 2(a) showing a state of the valve at its closed position, FIG. 2(b) showing a state of the valve during its opening action.
Figure 2B:
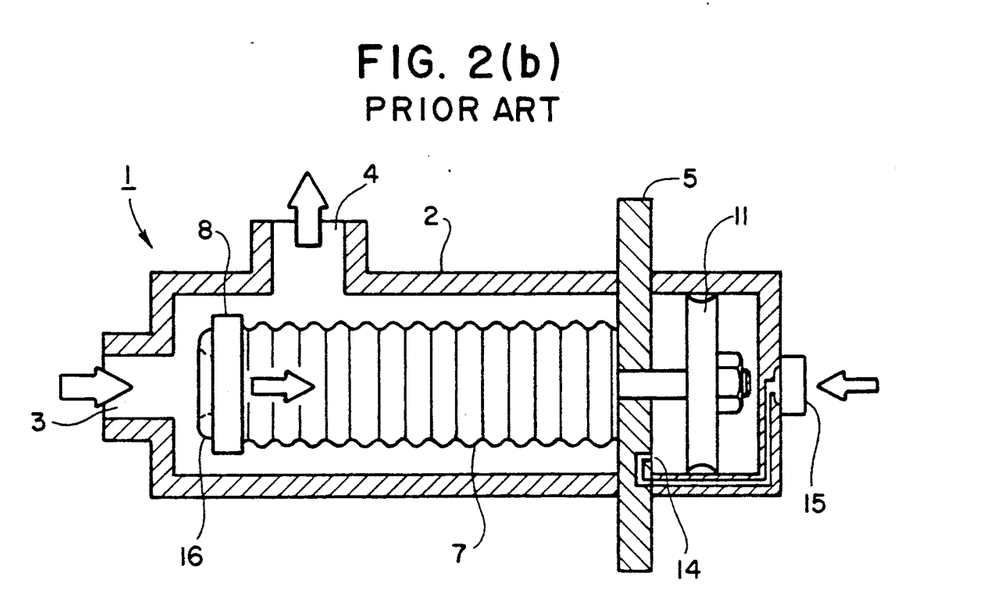

FIGS. 2(a) and 2(b) show the structure of a conventional lift valve. In order to facilitate readers understanding, movable component parts of the valve structure are shown in side views (partially cut-away side views in FIG. 2(a)), while members constituting a housing are shown in sectional views. FIG. 2(a) shows a state where the valve is closed, whereas FIG. 2(b) shows a stage of the valve in course of moving toward its open position.

As shown in these figures, in a valve 1, a valve inlet 3 connected to the associated vacuum chamber opens at one end of a cylindrical valve casing 2. The other end portion of the casing 2 is partitioned by a flange-shaped partition plate 5, and a compressed air inlet 15 is provided at this end.

A valve outlet 4 opens at a side-wall portion of the valve casing 2 which is between the valve inlet 3 and the partition plate 5.

A hollow bellows 7 has its one end fixed to the side of the partition plate 5 which faces the valve inlet 3. A valve plug 8 for opening and closing the valve inlet 3 is secured to the other end of the bellows 7.

As shown in FIG. 2(a), the hollow bellows 7 is always urged by a push spring 9 disposed therein toward its expanded position, so that, normally, an O-ring 16 received in a groove formed in the front surface of the valve plug 8 closes the valve inlet 3. The O-ring 16 constitutes a valve seat 13.

A rod 10, one end of which is secured to the central portion of the valve plug 8, extends through the hollow inside of the bellows 7 where the push spring 9 is disposed. The other end of the rod 10 slidably passes through a center bore formed in the partition plate 5, with a packing 11 being fixed to this end by a screw. The packing 11 serves as a piston capable of sliding on the inner wall of the valve casing 2 while being in airtight contact therewith.

The compressed air inlet 15 communicates through a passage in the wall of the valve casing 2 to a spouting hole 14 opening in the surface of the partition plate 5 which faces the packing 11. As show in FIG. 2(b), when a compressed nitrogen gas or the like is introduced from the inlet 15, the packing 11 moves in such a manner as to contract the bellows 7. As a result, the valve plug 8 is separated from the valve seat 13, thereby opening the valve inlet 3. This condition shows the valve opening operation.

With the above-described manner of opening and closing a valve used in the conventional apparatus, the sectional area of the valve opening is relatively large in general, and the sectional area of the opening at the valve inlet 3 cannot be other than that corresponding to the completely open or completely closed state of the valve inlet.

In the example shown in FIGS. 2(a) and 2(b), the structure of the lift valve is such that the direction of movement of the valve plug 8 aligns with the center axis of the valve seat 13, whereas the directions in which gas flows through the valve inlet 3 and outlet 4 are normal to each other. There are a lot of variations in the structure of lift valves. In order to reduce resistance to gas being exhausted, the flows of gas should preferably be in the same direction.

Figure 3:
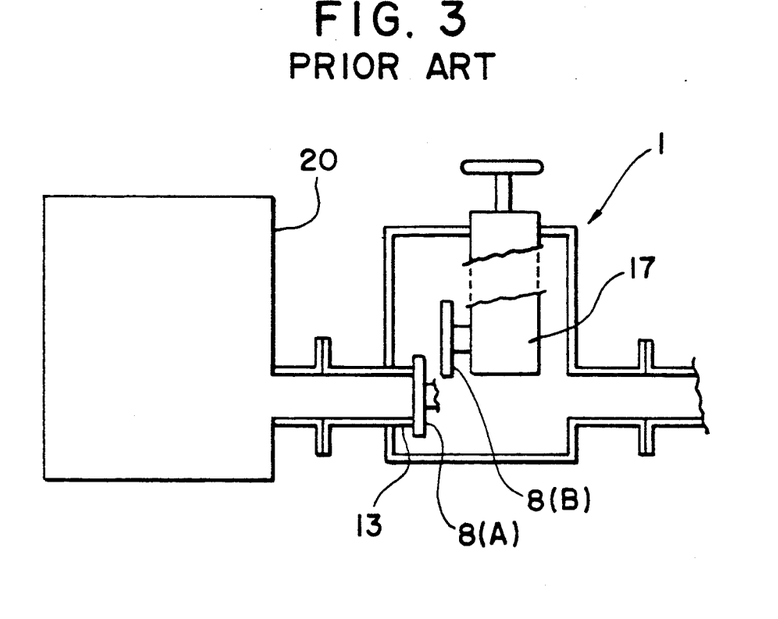
FIG. 3 is a block diagram showing the structure of another conventional lift valve.

In order to meet this requirement, a valve is known, in which, although a surface of the valve plug is parallel to the valve seat, the valve plug moves in a direction obliquely diverging from the center axis. The principle of such a valve will be explained with reference to FIG. 3 showing the valve in section. A moving mechanism 17 causes a valve plug 8 to move from a position A to a position B. When the valve is in its open state, the exhaust conductance is substantially free from any influence by the insertion of the valve.

Figure 4:
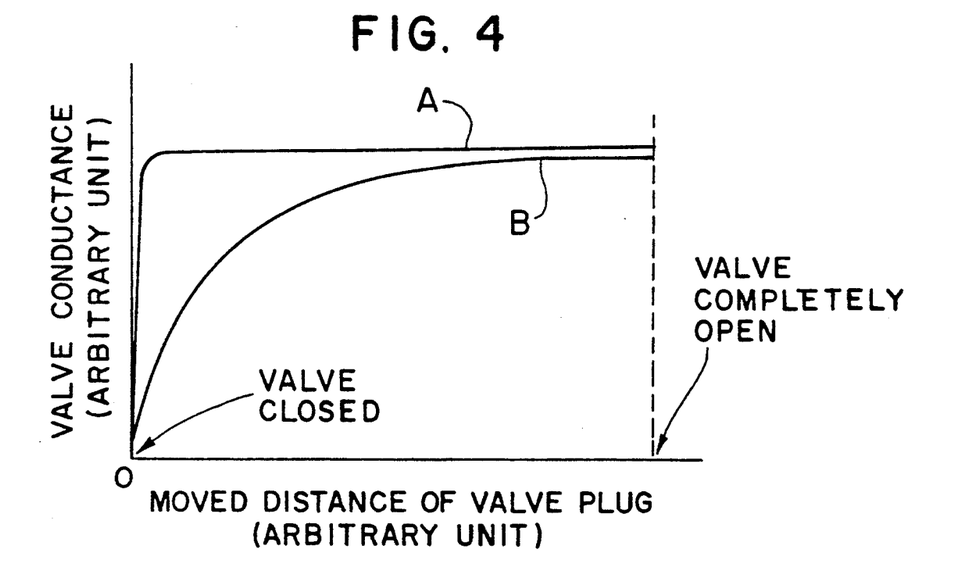
FIG. 4 is graph showing two different characteristic curves representing the relationship between the position of a valve plug during its movement and the valve conductance.

Referring to FIG. 4, the curve A indicates changes occurring in the conductance of the valve shown in FIGS. 2(a) and 2(b) as the opening or closing action of the valve proceeds. The conductance reaches to a certain fixed value at a time substantially concurrent with the start of the opening action of the valve. Accordingly, during an exhausting operation of the associated vacuum chamber, at an early stage of the operation, the interior of the chamber is directly connected with an exhaust system at a low degree of vacuum of about $10^{-3}$ Pa substantially concurrently with the start of the valve opening. Thus, the interior of the vacuum chamber, which is substantially at atmospheric pressure, experiences a rapid difference in pressure.

Figure 5:
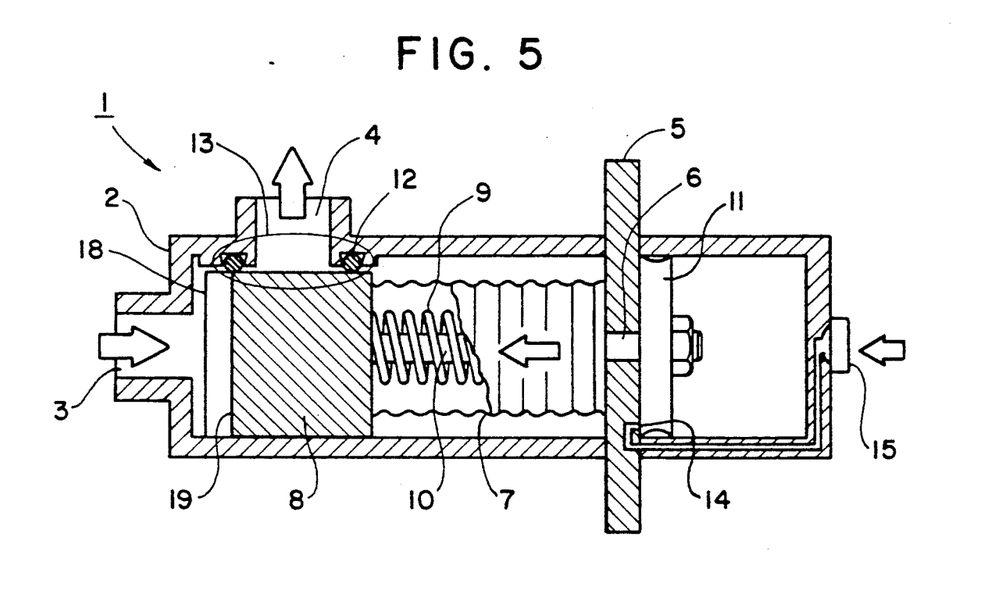
FIG. 5 is a partially cut-away sectional view of an embodiment of a valve used in a processing apparatus at reduced pressure according to the present invention, showing a state of the valve at its closed position.

FIG. 5 shows an embodiment of a valve used in a processing apparatus at reduced pressure according to the present invention.

As shown in FIG. 5, a valve 1 has a valve casing 2 which is formed as a casting having an inner diameter of 200 mm $\phi$. A flanged partition plate 5 is inserted into the casing 2 and is joined thereto by its flange portion.

A valve inlet 3 and a valve outlet 4 define two openings of which the inner diameters are 120 mm $\phi$ and 80 mm $\phi$, respectively.

A gasket (O-ring) 12 made of silicone rubber constitutes a valve seat 13. The ring 12 projects from the associated wall surface by 0.5 mm while being fit in an annular groove, which groove has a trapezoidal section so as to prevent the ring from becoming easily disengaged.

The inner surface of the valve casing 2 is cylindrical except that a surface portion where the valve outlet 4 opens is formed into a flattened surface.

Figure 7:
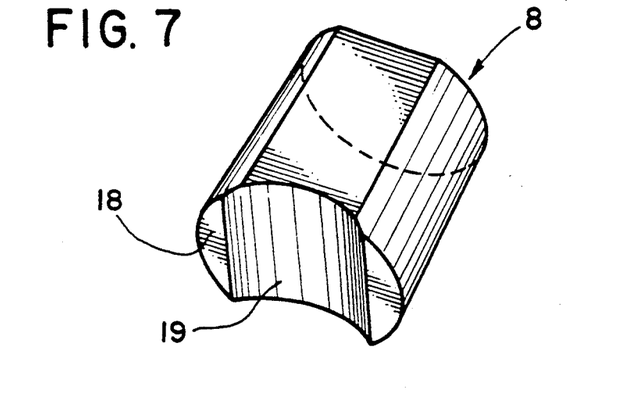
FIG. 7 is a perspective view of a valve plug which may be used in the valve shown in FIGS. 5 and 6, the valve plug having a groove.

A bellows 7 is made of brass, while a valve plug 8 is made of aluminum. The valve plug has a groove 19 formed in the forward end surface 18, the groove extending in a diametric direction parallel to the center axis of the valve outlet 4. This end surface has a configuration such as that shown in FIG. 7, which is a perspective view of the valve plug 8. Although in this illustrated example the groove 19 has a circular section, the groove may not necessarily have this configuration, and various modifications to the groove configuration are possible.

The valve casing 2 and the valve plug 8 have their dimensions determined in relation to each other so that the valve plug 8 is slide-fit in the casing and is slidable within the casing 2. A surface of the valve plug 8 where the plug slides is coated with a vacuum grease of silicone.

A packing 11 is also made of silicone rubber. A vacuum grease of silicone is applied as a lubricant on the surface of the packing 11 where the packing slides on the valve casing 2.

The valve plug 8 is urged by a coil spring of phosphor bronze having a force of 1 kg at a valve closed position. A compressed air inlet 15 allows the flow therein of a compressed nitrogen gas at 5 atms while the flow is regulated by a flow regulating valve, not shown, so that it is possible to control the movement of the valve plug 8.

Figure 6:
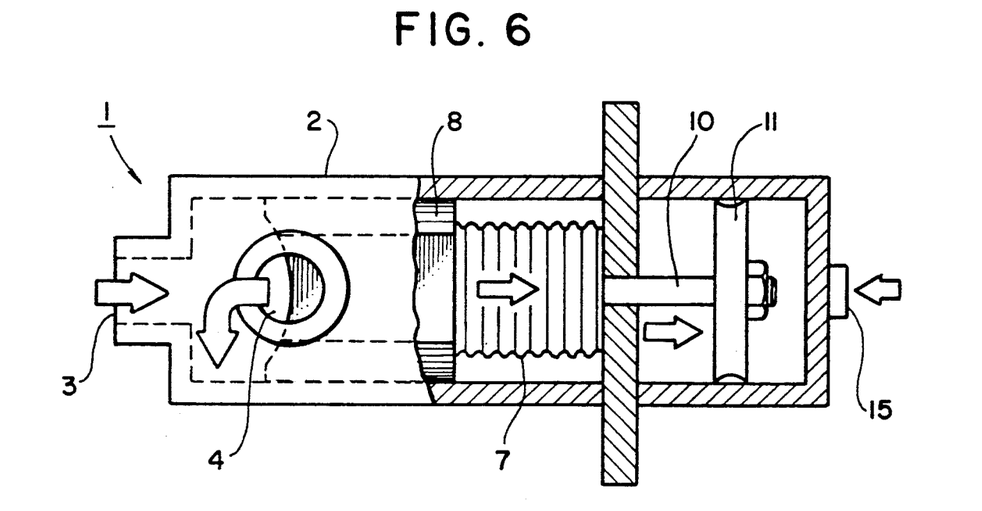
FIG. 6 is a partially-sectioned side view showing a state of the valve shown in FIG. 5 during its opening action.

FIG. 6 is a side view taken from the side of the valve outlet 4. Shown in this figure is a state in which a nitrogen gas flowing in from the compressed air inlet 15 causes gradual movement of the packing 11 so that the valve plug 8 with the groove 19 renders part of the valve outlet 4 open.

Referring to FIG. 4, the curve B indicates changes occurring in the conductance of the valve 1 as the valve plug 8 moves. Suitable control over the flow of compressed air from the inlet 15 makes it possible to control the valve conductance in such a manner that it changes in a wide range. Thus, in the valve according to the present invention, the valve plug 8 functions as a gate which determines the opening area of the valve seat 13. When the valve 1 is gradually opened, it is possible to prevent any rapid difference in pressure, hence, any stirring up of particles within the associated chamber.

Although the above-described groove 19 on the front end surface of the valve plug 8 is formed with a circular sectional configuration, this configuration may be modified in various ways, as stated before. A change in the groove configuration causes a corresponding change in the valve conductance curve plotted against the movement of the valve plug.

In the valve shown in FIGS. 5 and 6, the flow of gas being exhausted through the valve is bent in such a manner that the incoming flow is substantially normal to the outgoing flow. However, it would be easily understood that the present invention is also applicable to the case where the incoming and outgoing flows of gas are in the same direction. Such an embodiment is shown in FIG. 8, which is a fragmentary sectional view of a valve through which gas flows in a single direction.

Specifically, a valve 1 has a box-shaped valve casing 2. A valve inlet 3 and a valve outlet 4 respectively open at upper and lower portions, as viewed in the figure, with their center axes aligned with each other. A valve plug 8 is a prism-shaped member, and is provided with O-rings 12a and 12b at which the valve plug 8 is kept in airtight contact with upper and lower valve seats 13a and 13b when at a valve closed position.

The valve plug 8 can be moved by an external means (not shown) in the direction indicated by the black arrow in the figure. A groove 19 is formed in the left end surface (as viewed in the figure) of the valve plug 8. During the opening of the valve 1, as the valve plug 8 moves rightward, the valve 1 is opened gradually, with the valve conductance changing in a manner similar to that indicated by the curve B in FIG. 4.

Figure 8:
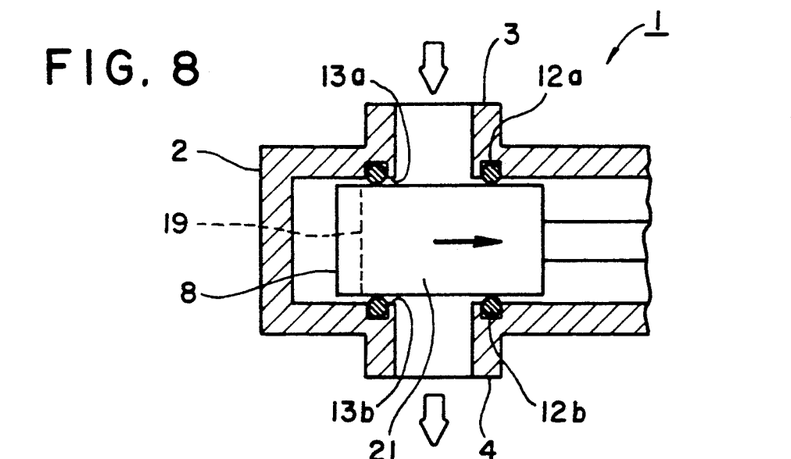
FIG. 8 is a fragmentary sectional view of another embodiment of a valve used in the apparatus according to the present invention, in which the associated pipes are aligned with the direction of the flow of gas.
Figure 11:
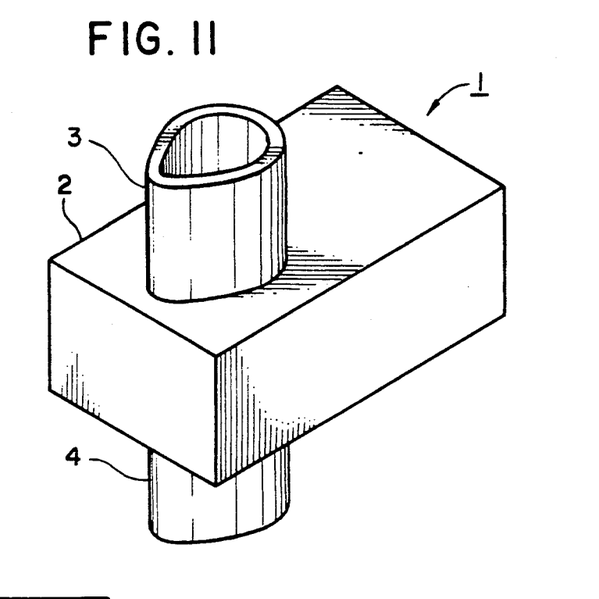
FIG. 11 is a modification of the valve shown in FIG. 8 or 9, the configuration of the valve inlet and outlet being modified.

Each of the valve inlet 3 and the valve outlet 4 shown in FIG. 8 defines therein an opening with a circular configuration. In order to achieve a more gradual change in the valve conductance, it is effective to adopt a triangular, quadrangular, egg-shaped or elliptical configuration for the openings of the inlet and/or outlet valve seats or pipes. FIG. 11 is a perspective view of a valve 1 whose valve inlet 3 and valve outlet 4 are formed by using pipes having an egg-shaped section.

Figure 9:
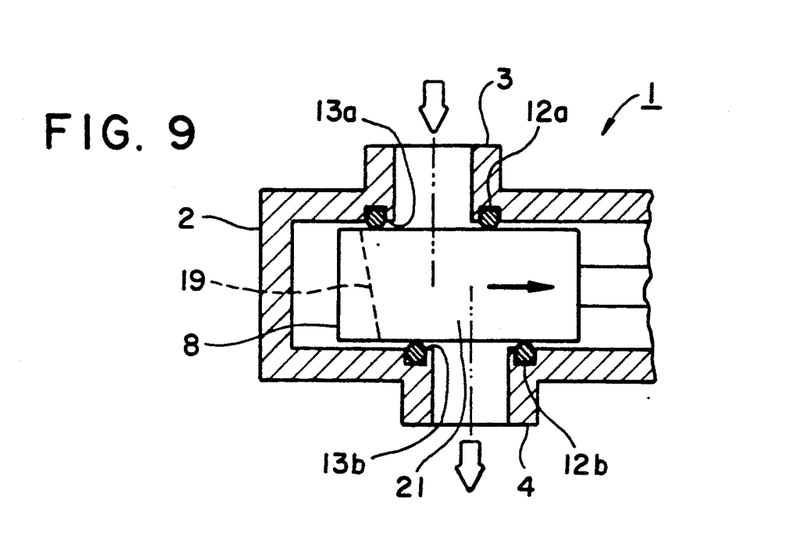
FIG. 9 is a fragmentary sectional view of a further embodiment of a valve used in the apparatus according to the present invention, in which the pipe on the vacuum chamber side and that on the pump side are offset relative to each other.

The present invention is applicable to, in addition to a valve having a structure where the center axes of the valve inlet and outlet are mutually aligned, a structure, such as that shown in FIG. 9, where the center axes of the valve inlet and outlet are offset relative to each other. In such cases, it is possible to obtain a valve possessing a further different characteristic.

Figure 10:
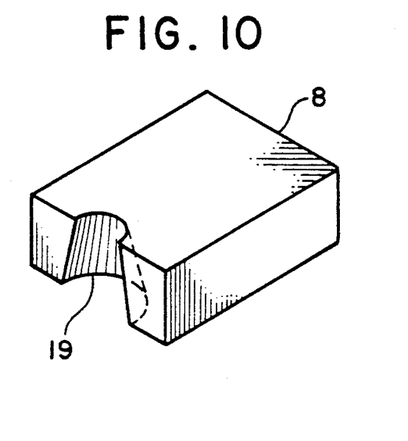
FIG. 10 is a perspective view of a valve plug which may be used in the valve shown in FIG. 8 or 9, the valve plug having a modified groove.

In the embodiments shown in FIGS. 8 and 9, the groove formed in the end face of the valve plug 8 may not necessarily be a groove (e.g., a groove of a circular section) having a constant depth. If the depth of the groove is varied between the side close to the valve inlet 3 and the side close to the valve outlet 4, this makes it possible to vary the manner in which the valve conductance changes with changes in the movement of the valve plug 8. FIG. 10 is a perspective view of a valve plug 8 having a groove 19 whose configuration is thus modified. In place of the groove, the valve plug may be formed such that two side surfaces 21 of FIG. 8 or 9, which are parallel to the axes of valve inlet and outlet, make an acute angle at the end of the valve plug.

In the embodiments shown in FIGS. 8, 9 and 11, the pair of surfaces of the valve plug 8 which open and close the valve inlet 3 and the valve outlet 4 are parallel to each other. However, these surfaces may not necessarily be parallel. If these surfaces form a certain angle relative to the moving direction of the valve plug 8, and the valve plug 8 is correspondingly wedge-shaped, this makes it possible to assure vacuum-tightness at a valve close position, and also to modify the rise of the characteristic curve B shown in FIG. 4.

Figure 12:
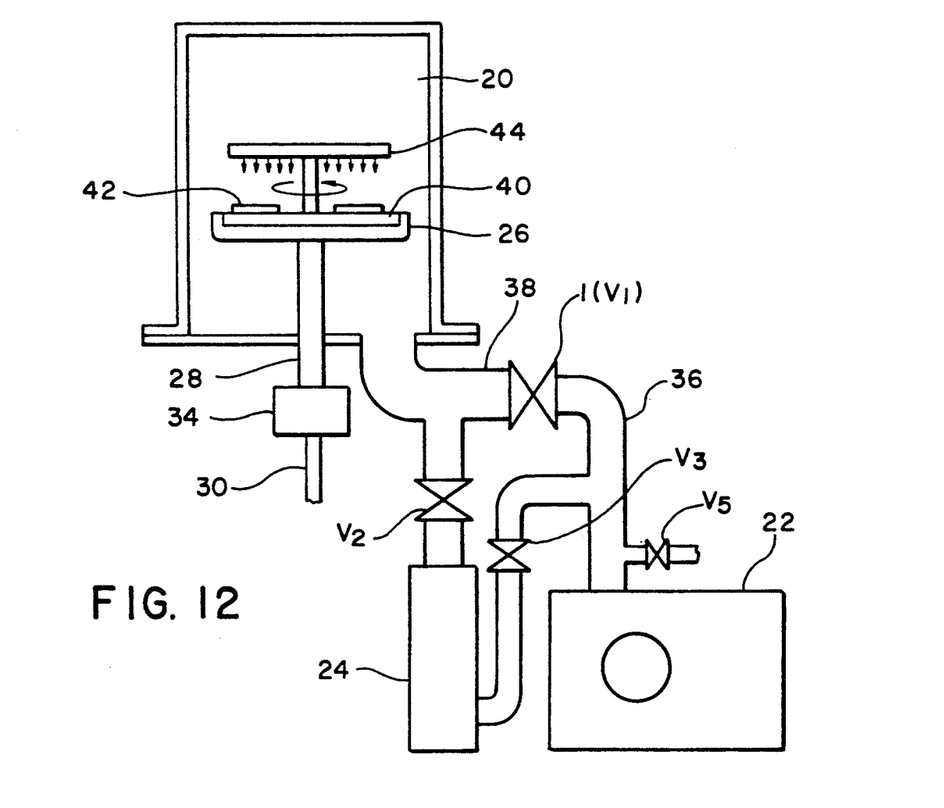
FIG. 12 is a block diagram of a CVD apparatus to which the present invention is applied.

FIG. 12 shows an example of a CVD (Chemical Vapor Deposition) apparatus to which the present invention is applied. Descriptions will be given while emphasis is placed on the difference from the apparatus shown in FIG. 1. The CVD apparatus includes a heater 40 provided on the stage 26 for heating a plurality of semiconductor wafers 42 to be processed. At a position above the semiconductor wafers 42, a rotary shower 44 for ejecting source gases is provided, and is adapted to eject source gases downward. The rotary shower 44 can be driven by a motor 34 provided outside the vacuum chamber 20.

The pumping system of the apparatus is devoid of the bypass 32 shown in FIG. 1. The vacuum chamber 20 is connected with the oil-sealed rotary pump 22 by pipes 38 and 36. The valve 1 according to the present invention is inserted (as the valve $V_1$) between the pipes 38 and 36 so as to prevent any stirring up of deposited substances within the vacuum chamber during rough pumping at the start of a processing operation. The valve 1 according to the present invention may also be used as the valve $V_2$ inserted between the high-pressure exhaust pump 24 and the chamber 20.

When a processing apparatus at reduced pressure having a valve according to the present invention is used, it is possible to lower the possibility of air being made turbulent by a rapid difference in pressure experienced by the interior of the chamber at the starting of the exhaust system. It is therefore possible to prevent any stirring up of particles within the chamber. This feature greatly helps to improve the yield of wafer processes in which the processing apparatus according to the present invention is employed.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. An apparatus for processing semiconductor wafers at reduced pressure comprising a vacuum chamber and a pumping system connected with the chamber, said pumping system including at least a roughing pump, an exhaust pipe connecting the chamber with the roughing pump and a valve inserted in said exhaust pipe for opening and closing gas flow therethrough, said valve comprising:

a valve casing having valve inlet and outlet openings connected with said exhaust pipe;
   a valve seat comprising a gasket surrounding at least one of said openings and having a first surface extending in a direction generally perpendicular to an axis of said opening; and
   a valve plug having a second surface, the second surface being parallel with the first surface and contacting airtightly with said gasket at a valve closed position, the valve plug being movable substantially in the direction along the first surface for closing and opening said valve, thereby causing said opening for gas flow to be opened or closed gradually by the slide movement of the second surface of the valve plug on said valve seat along the first surface.

2. An apparatus for processing semiconductor wafers at reduced pressure as recited in claim 1, wherein said valve seat is formed at both valve inlet and outlet openings, a first valve seat comprising said gasket having said first surface and a second valve seat comprising another gasket having a fourth surface, and wherein said valve plug further has a third surface, the third surface being parallel with the fourth surface and contacting airtightly with said another gasket at the valve closed position.

3. An apparatus for processing semiconductor wafers at reduced pressure, comprising a vacuum chamber and a pumping system connected with the chamber, said pumping system including at least a roughing pump, an exhaust pipe connecting the chamber with the roughing pump and a valve inserted in said exhaust pipe for opening and closing gas flow therethrough, said valve comprising:
a valve casing having valve inlet and outlet openings connected with said exhaust pipe;
a valve seat comprising a gasket surrounding at least one of said openings and having a first surface extending in a direction generally perpendicular to an axis of said opening; and
a valve plug having a second surface, the second surface being parallel with the first surface and contacting airtightly with said gasket at a valve closed position, the valve plug being movable substantially in the direction of the first surface for closing and opening said valve, thereby causing said opening for gas flow to be opened or closed gradually by the movement of the second surface of the valve plug; and
wherein said valve plug has an end surface which intersects the second surface, and a groove is formed in the end surface removing an end portion of said second surface of the valve plug, the end portion being capable of traversing said valve seat.

4. An apparatus for processing semiconductor wafers at reduced pressure as recited in claim 2, wherein said first through fourth surfaces are substantially parallel and said valve plug has an end surface which intersects said second and third surfaces of the valve plug, and a groove is formed in the end surface by removing an end portion of at least one of said second and third surfaces of the valve plug, the end portion being capable of traversing said valve seat.

5. An apparatus for processing semiconductor wafers at reduced pressure as recited in claim 4, wherein the valve casing has a cylindrical shape, said first and second valve seats are formed on an inside surface of the cylindrical valve casing and said valve plug has a cylindrical shape having said second and third surfaces on the side walls thereof.

6. An apparatus for processing semiconductor wafers at reduced pressure as recited in claim 4, wherein the center axes of said valve inlet and outlet openings are arranged substantially on a straight line.

7. An apparatus for processing semiconductor wafers at reduced pressure as recited in claim 4, wherein the center axes of said valve inlet and outlet openings are parallel and offset relative to each other.

8. An apparatus for processing semiconductor wafers at reduced pressure as recited in claim 4, wherein said groove is formed having an inclination into the end surface and said removed end portions on the second and third surfaces have different areas.

9. An apparatus for processing semiconductor wafers at reduced pressure as recited in claim 2, wherein an angle is formed by the first and fourth surfaces of the valve seats, the angle being substantially equal to that formed by the second and third surfaces of the valve plug, thereby enabling the valve plug to close both valve seats in a manner similar to a wedge being driven.

10. An apparatus for processing semiconductor wafers at reduced pressure comprising a vacuum chamber and a pumping system connected with the chamber, said pumping system including at least a roughing pump, an exhaust pipe connecting the chamber with the roughing pump and a valve inserted in said exhaust pipe for opening and closing gas flow therethrough, said valve comprising:
a valve casing having valve inlet and outlet openings connected with said exhaust pipe, said valve casing has a cylindrical wall and two end surfaces vertical thereto forming an enclosure;
a valve seat comprising a gasket surrounding at least one of said openings and having a first surface, said valve outlet opening and said valve seat being formed in the cylindrical wall, said valve inlet opening being formed in one of the end surfaces; and
a valve plug having a second surface, the second surface being parallel with the first surface and contacting airtightly with said gasket at a valve closed position, said valve plug being movable substantially in the direction of the first surface and the center axis of the cylindrical wall for closing and opening said valve, thereby causing said opening for gas flow to be opened or closed gradually by the movement of the second surface of the valve plug.

11. An apparatus for processing semiconductor wafers at reduced pressure as recited in claim 1, wherein said valve further comprises a partition plate in an enclosure separating the inside thereof into a valve section and a driving section, the driving section further comprising means for driving the valve plug.

12. An apparatus for processing semiconductor wafers at reduced pressure as recited in claim 11, wherein said driving means includes an airtightly movable packing means which is located inside said driving section forming a pressure compartment with the partition plate, said valve plug being connected airtightly with the packing means, said driving means further including means for admitting compressed air into the pressure compartment.

13. An apparatus for processing semiconductor wafers at reduced pressure as recited in claim 1, wherein at least one of said valve inlet and outlet openings has a configuration selected from among circular, triangular, quadrangular, elliptical and egg-shaped configurations.

14. A valve for opening and closing gas flow installed in an exhaust system, said valve comprising:
a valve casing having valve inlet and outlet openings connected with said exhaust pipe;
a valve seat comprising a gasket surrounding at least one of said openings and having a first surface; and
a valve plug having a second surface, the second surface being parallel with the first surface and contacting airtightly with said gasket at a valve closed position, the valve plug being movable substantially in the direction along the first surface for closing and opening said valve, thereby causing said opening for gas flow to be opened or closed gradually by the slide movement of the second surface of the valve plug on said valve seat along the first surface.

15. A valve for opening and closing gas flow installed in an exhaust system as recited in claim 14, wherein said valve seat is formed at both valve inlet and outlet openings, a first valve seat comprising said gasket having said first surface and a second valve seat comprising another gasket having a fourth surface, and wherein said valve plug further has a third surface, the third surface being parallel with the fourth surface and contacting airtightly with said another gasket at the valve close position.

16. A valve for opening and closing gas flow installed in an exhaust system, said valve comprising:
- a valve casing having valve inlet and outlet openings connected with said exhaust pipe;
- a valve seat comprising a gasket surrounding at least one of said openings and having a first surface extending in a direction generally perpendicular to an axis of said opening; and
- a valve plug having a second surface, the second surface being parallel with the first surface and contacting airtightly with said gasket at a valve closed position, the valve plug being movable substantially in the direction of the first surface for closing and opening said valve, thereby causing said opening for gas flow to be opened or closed gradually by the movement of the second surface of the valve plug; and
- wherein said valve plug has an end surface which intersects the second surface, and a groove is formed in the end surface removing an end portion of said second surface of the valve plug, the end portion being capable of traversing said valve seat.

17. A valve for opening and closing gas flow installed in an exhaust system as recited in claim 15, wherein said first through fourth surfaces are substantially parallel and said valve plug has an end surface which intersects said second and third surfaces of the valve plug, and a groove is formed in the end surface by removing an end portion of said second and/or third surfaces of the valve plug, the end portion being capable of traversing said valve seat.

18. An apparatus for processing semiconductor wafers at reduced pressure as recited in claim 5, wherein the center axes of said valve inlet and outlet openings are arranged substantially on a straight line.

19. An apparatus for processing semiconductor wafers at reduced pressure as recited in claim 5, wherein the center axes of said valve inlet and outlet openings are parallel and offset relative to each other.

20. An apparatus for processing semiconductor wafers at reduced pressure as recited in claim 5, wherein said groove is formed having an inclination into the end surface and said removed end portions on the second and third surfaces have different areas.

21. An apparatus for processing semiconductor wafers at reduced pressure as recited in claim 2, wherein said valve further comprises a partition plate in an enclosure separating the inside thereof into a valve section and a driving section, the driving section further comprising means for driving the valve plug.

22. An apparatus for processing semiconductor wafers at reduced pressure as recited in claim 10, wherein said valve further comprises a partition plate in said enclosure separating the inside thereof into a valve section and a driving section, the driving section further comprising means for driving the valve plug.

23. An apparatus for processing semiconductor wafers at reduced pressure as recited in claim 2, wherein at least one of said valve inlet and outlet openings has a configuration selected from among circular, triangular, quadrangular, elliptical and egg-shaped configurations.

* * * * *